United States Patent
Tripathi et al.

(10) Patent No.: US 12,249,957 B2
(45) Date of Patent: Mar. 11, 2025

(54) SELF-BIASED, CLOSED LOOP, LOW CURRENT FREE RUNNING OSCILLATOR

(71) Applicant: NXP USA, Inc., Austin, TX (US)

(72) Inventors: Divya Tripathi, Noida (IN); Sadique Mohammad Iqbal, Karimganj (IN); Anubhav Srivastava, Gorakhpur (IN); Krishna Thakur, GautamBudh Nagar (IN); Pragya Priya Malakar, Chandler, AZ (US); John Pigott, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/296,539

(22) Filed: Apr. 6, 2023

(65) Prior Publication Data

US 2024/0113660 A1    Apr. 4, 2024

(30) Foreign Application Priority Data

Sep. 30, 2022   (IN) ............... 202211056103

(51) Int. Cl.
    *H03L 7/02*    (2006.01)
    *H03B 5/04*    (2006.01)
    *H03B 5/24*    (2006.01)

(52) U.S. Cl.
    CPC .............. *H03B 5/04* (2013.01); *H03B 5/24* (2013.01); *H03L 7/02* (2013.01)

(58) Field of Classification Search
    CPC ....................................................... H03L 7/02
    See application file for complete search history.

(56) References Cited

U.S. PATENT DOCUMENTS

| | | |
|---|---|---|
| 8,497,741 B2 | 7/2013 | Pedersen et al. |
| 8,994,459 B2 | 3/2015 | Patsani et al. |
| 9,287,823 B1 | 3/2016 | Holzmann |
| (Continued) | | |

OTHER PUBLICATIONS

Dai et al.: "A 14.4nW 122KHz Dual-phase Current-mode Relaxation Oscillator for Near-Zero-Power Sensors", 2015 IEEE Custom Integrated Circuits Conference (CICC), Sep. 28-30, 2015, DOI: 10.1109/CICC.2015.7338396, San Jose, CA, USA, pp. 1-4.

*Primary Examiner* — Ryan Johnson

(57) ABSTRACT

A self-biased, closed loop, low current free running oscillator clock generator method and apparatus are provided with a current mode comparator connected to a trimming resistor and configured to compare an internally generated voltage reference $V_{REF}$ signal to a voltage feedback signal $V_{FB}$, where the current mode comparator comprises a common gate amplifier connected to a current mirror circuit in a negative self-biased closed loop to generate a control current signal for controlling a current controlled oscillator to produce an output clock signal having a clock frequency based on the control current signal, where a frequency-to-voltage converter is connected in a feedback path to receive the output clock signal and is configured to produce the voltage feedback signal $V_{FB}$ for input to the current mode comparator, wherein the clock frequency of the output clock signal is tuned to a nominal locked output frequency $f_{OUT}$ by the trimming resistor.

19 Claims, 3 Drawing Sheets

(56) References Cited

U.S. PATENT DOCUMENTS

| 10,985,767 | B2 | | 4/2021 | Chen et al. | |
|---|---|---|---|---|---|
| 2011/0156760 | A1 | * | 6/2011 | Bhuiyan | H03K 17/162 331/16 |
| 2012/0161868 | A1 | * | 6/2012 | Yayama | H03L 1/00 330/252 |
| 2014/0002197 | A1 | * | 1/2014 | Patasani | H03L 7/02 331/34 |
| 2014/0312981 | A1 | * | 10/2014 | Nakamura | H03L 1/022 331/34 |
| 2015/0180483 | A1 | * | 6/2015 | Astrom | H03L 7/18 331/25 |

* cited by examiner ize digital PLL circuit
SELF-BIASED, CLOSED LOOP, LOW CURRENT FREE RUNNING OSCILLATOR

CROSS-REFERENCE TO RELATED APPLICATIONS

This application claims the priority under 35 U.S.C. § 119 of India application No. 202211056103, filed on 30 Sep. 2022, the contents of which are incorporated by reference herein.

BACKGROUND OF THE INVENTION

Field of the Invention

The present invention is directed in general to electronic circuits. In one aspect, the present invention relates to integrated circuit free running oscillator for producing digital clock signals.

Description of the Related Art

Integrated circuit devices, such as Systems on a Chip (SoC) devices, include clock generator circuits which generate clock signals for many applications and functions. For example, with SoC devices which operate in a low power mode, a low frequency clock is required to be present for wake-up timer and real-time clock (RTC) applications. These clocks are generally provided by a 32 KHz free running oscillator (FRO) which is always kept ON, thereby requiring very low power consumption for the FRO. Conventionally, phase locked loop (PLL) clock generators have been used with larger SoC devices to accurately multiply a reference crystal clock to generate stable high frequency clock signals by using a negative feedback loop to generate a supply, temperature and process in-sensitive clock with very small frequency spread. However, in smaller integrated circuit systems, PLL-based clock generators are not feasible because they require an external reference crystal clock and a voltage/current reference generator. An alternative approach to PLL-based clock generators is to connect an RC oscillator, such as a voltage or current controlled oscillator, in a negative feedback loop to provide a free running oscillator circuit that mimics the PLL performance. However, the performance of on-chip resistors and capacitors can vary across process, supply voltage and temperature (PVT) parameters which causes the frequency of the oscillator to vary significantly, thereby affecting the system performance. In addition, any mismatch between control voltage ($V_{CTL}$) provided to the voltage-controlled oscillator and the reference voltage ($V_{REF}$) can lead to non-linearity. Another drawback with existing solutions is that they require a reference voltage and/or bias current generator circuit which consumes significant power and area of the overall integrated circuit system. As a result, the existing solutions for accurately generating clock signals are extremely difficult at a practical level in terms of generating a digital controlled output clock signal with a compact size digital PLL circuit that provides fine control of the output clock signal with reduced power consumption and low variation.

BRIEF DESCRIPTION OF THE DRAWINGS

The present invention may be understood, and its numerous objects, features and advantages obtained, when the following detailed description is considered in conjunction with the following drawings.

DETAILED DESCRIPTION

Figure 1:
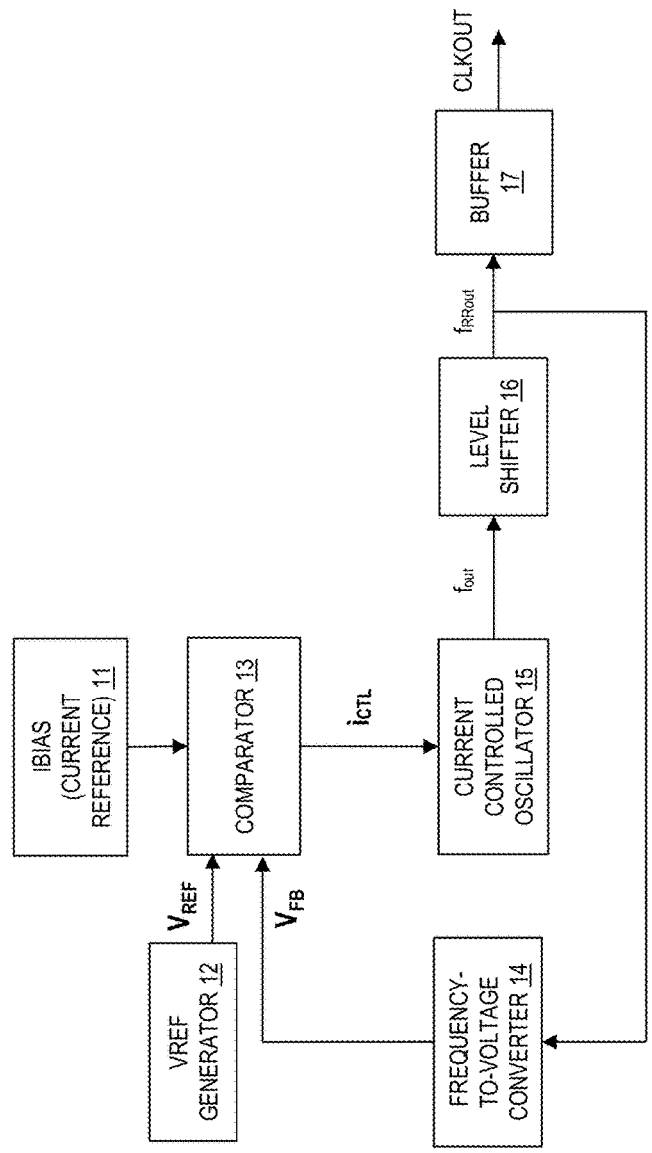
FIG. 1 illustrates a high-level block diagram of a conventional clock generator which uses a closed-loop free running oscillator circuit with separate current/voltage reference circuit and frequency-to-voltage subblocks.

A low current, self-biased, closed-loop, free running oscillator (FRO) circuit, apparatus, and method of operation are described for use with applications requiring low current operation, such as low frequency clock generators required in low power modes. As disclosed, the self-biased, closed-loop FRO circuit includes a switched capacitor frequency-to-voltage converter and a current mode comparator which internally generates a voltage reference, thereby eliminating any required external voltage reference generator circuit to provide a low current, low circuit area solution. In selected embodiments, the disclosed switched capacitor frequency-to-voltage converter is connected to receive the output clock signal frequency in feedback and to generate a feedback voltage ($V_{FB}$). In addition, the disclosed current mode comparator uses an RC-based oscillator wherein a common gate amplifier circuit and current mirror circuit are connected in a negative self-biased feedback loop to receive an internally-generated reference voltage ($V_{REF}$) and the feedback voltage ($V_{FB}$) to ensure that any frequency drift due to voltage is kept within tolerance. In particular, the common gate amplifier circuit may include first and second NMOS transistors, where the first NMOS transistor is connected to ground over a trimmed resistor (thereby internally generating the reference voltage ($V_{REF}$)) and where the second NMOS transistor is connected to ground over to the switched capacitor frequency-to-voltage converter that is driven by the oscillator frequency, thereby generating the feedback voltage ($V_{FB}$). In addition, the current mirror circuit may include a plurality of gate-connected PMOS devices forming a PMOS current mirror that are connected between the supply voltage Vdd and the common gate amplifier circuit to generate a positive bias signal for supplying or controlling a current controlled oscillator (CCO) which generates an output frequency signal. While the disclosed self-biased, closed-loop FRO circuit can be used to generate clock signals for low current, low frequency applications (e.g., 32 KHz clock outputs at 90 nA), the disclosed self-biased, closed-loop FRO circuit can also be used for implementing high frequency FROs with good figure of merit.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified block diagrams and schematic circuit block diagrams without including every circuit element or detail in order to avoid limiting or obscuring the present invention. Such descriptions and representations are used by those skilled in the art to describe and convey the substance of their work to others skilled in the art. It is also noted that, throughout this detailed description, certain elements in the FIGS. are illustrated for simplicity and clarity and have not necessarily been drawn to illustrate specific details. Furthermore, the described features, advantages, and characteristics of the invention may be combined in any suitable manner in one or more embodiments. One skilled in the relevant art will recognize, in light of the description herein, that the embodiments can be practiced without one or more of the specific features or advantages of a particular embodiment. In other instances, additional features and advantages may be recognized in certain embodiments that may not be present in all embodiments. For example, selected aspects are depicted with reference to simplified circuit schematic drawings without including every circuit detail in order to avoid limiting or obscuring the present invention. Such details are well known and not considered necessary to teach one skilled in the art of how to make or use the present invention.

To provide additional details for a contextual understanding of the present disclosure, reference is now made to FIG. 1 which shows a high-level block diagram of a conventional clock generator 10 in which a current controlled oscillator 15 is controlled by a comparator and connected as a closed-loop free running oscillator (FRO) circuit with separate current/voltage reference circuit subblocks 11, 12 and a frequency-to-voltage converter subblock 14 connected to provide a feedback voltage $V_{FB}$ to the comparator 13. As depicted, the clock generator 10 includes a comparator circuit 13, a current controlled oscillator (CCO) 15, and a level shifter 16 connected in a closed-loop feedback arrangement with a frequency-to-voltage converter 14, thereby forming a closed-loop free running RC oscillator circuit. In the clock generator 10, the comparator 13 is connected to receive a reference current from a reference or bias current (IBIAS) generator subblock 11. In addition, the comparator 13 is connected to receive a reference voltage ($V_{REF}$) from the $V_{REF}$ generator subblock 12, where the reference voltage is compared to the feedback voltage $V_{FB}$ provided by the frequency-to-voltage converter 14.

In this configuration, the current controlled oscillator 15 is adapted to generate a clock signal $f_{out}$ based on a control voltage or current signal $i_{CTL}$ generated by the comparator 13. Since the generated clock signal $f_{out}$ has an output swing that is not a rail-to-rail clock, the clock signal $f_{out}$ is supplied to the level shifter unit 16 which may be used to convert the CCO output to a rail-to-rail clock signal $f_{RRout}$ that is supplied to the output buffer 17 which generates the output clock signal CLKOUT. In addition, the rail-to-rail clock signal $f_{RRout}$ generated by the level shifter unit 16 is supplied to the frequency-to-voltage converter 14 which is used to convert the input frequency to the feedback voltage ($V_{FB}$) which is provided to the comparator 12 for comparison with the reference voltage ($V_{REF}$) from the $V_{REF}$ generator 12. In conventional implementations, the comparator 13 may be implemented as an operational amplifier with an inverting input terminal connected to receive the reference voltage $V_{REF}$ and with the non-inverting input terminal connected to receive the feedback voltage $V_{FB}$. In such implementations, the output signal of the operational amplifier/comparator 13 is provided as the control voltage or current signal $i_{CTL}$ for controlling the current controlled oscillator 15 in order to control the frequency of the clock signal $f_{out}$. As will be appreciated by those skilled in the art, the depicted clock generator 10 provides a closed-loop FRO circuit which has separate reference voltage and bias current generator subblocks 11, 12 which increase the required integrated circuit area and power consumption in applications where the oscillator is required to be continuously present. In addition, the depicted clock generator 10 includes a separate frequency-to-voltage converter subblock 14 which further increases the required circuit area.

To address these shortcomings from conventional solutions and others known to those skilled in the art, there is disclosed herein a low current, self-biased, closed-loop, free running oscillator (FRO) circuit, apparatus, and method of operation which does not require any external or internal reference current or voltage generator circuit. In selected embodiments, the low current, self-biased, closed-loop FRO circuit is implemented with a current mode comparator which internally generates a voltage reference, thereby eliminating any required external voltage reference generator circuit to provide a low current, low circuit area solution.

Figure 2:
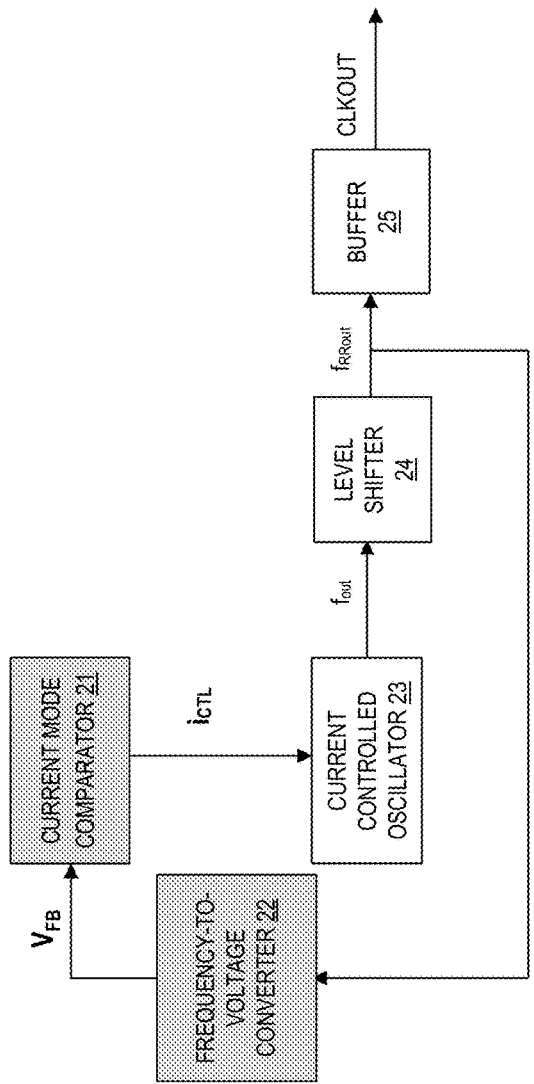
FIG. 2 illustrates a high-level block diagram of clock generator which uses a self-biased, closed-loop free running oscillator circuit which does not require a separate current/voltage reference circuit subblock in accordance with selected embodiments of the present disclosure.

To illustrate selected embodiments of the low current, self-biased, closed-loop FRO circuit, reference is now made to FIG. 2 which illustrates a high-level block diagram of a clock generator 20 which includes a current mode comparator circuit 21, a current controlled oscillator (CCO) 23, a level shifter 24, a buffer 25, and a frequency-to-voltage converter 22 connected in a closed-loop feedback arrangement which does not require a separate current/voltage reference circuit subblock. In the depicted clock generator 20, the current mode comparator 21 is not connected to receive a reference voltage from an external reference voltage generator, but is instead configured to internally generate a reference voltage $V_{REF}$. In addition, the current mode comparator 21 is connected to receive a feedback voltage $V_{FB}$ provided by the frequency-to-voltage converter 22. In selected embodiments, the frequency-to-voltage converter 22 is integrated with the current mode comparator 21, as indicated with the shaded coloring of blocks 21-22.

As described more fully below, the current mode comparator 21 may use an RC-based oscillator configuration which includes a common gate amplifier circuit and current mirror circuit connected in a negative self-biased feedback loop to receive an internally-generated reference voltage ($V_{REF}$) and a feedback voltage ($V_{FB}$) to ensure that variation in frequency is dependent only on R and C values. In response to comparing the feedback voltage $V_{FB}$ to the internally generated reference voltage $V_{REF}$, the current mode comparator 21 generates a control voltage or current signal $i_{CTL}$ which is supplied to control the current controlled oscillator 23 which is adapted to generate a clock signal $f_{out}$ in response to the control current signal $i_{CTL}$. In situations where the generated clock signal $f_{out}$ has an output swing that is not a rail-to-rail clock, the clock signal $f_{out}$ may be supplied to the level shifter unit 24 which converts the clock signal $f_{out}$ output from the CCO 23 to a rail-to-rail clock signal $f_{RRout}$ that is supplied to the output buffer 25 which generates the output clock signal CLKOUT. In addition, the rail-to-rail clock signal $f_{RRout}$ generated by the level shifter unit 24 is supplied to the frequency-to-voltage converter 22 which is used to convert the input frequency to the feedback voltage ($V_{FB}$) which is provided to the current mode comparator 21.

Figure 3:
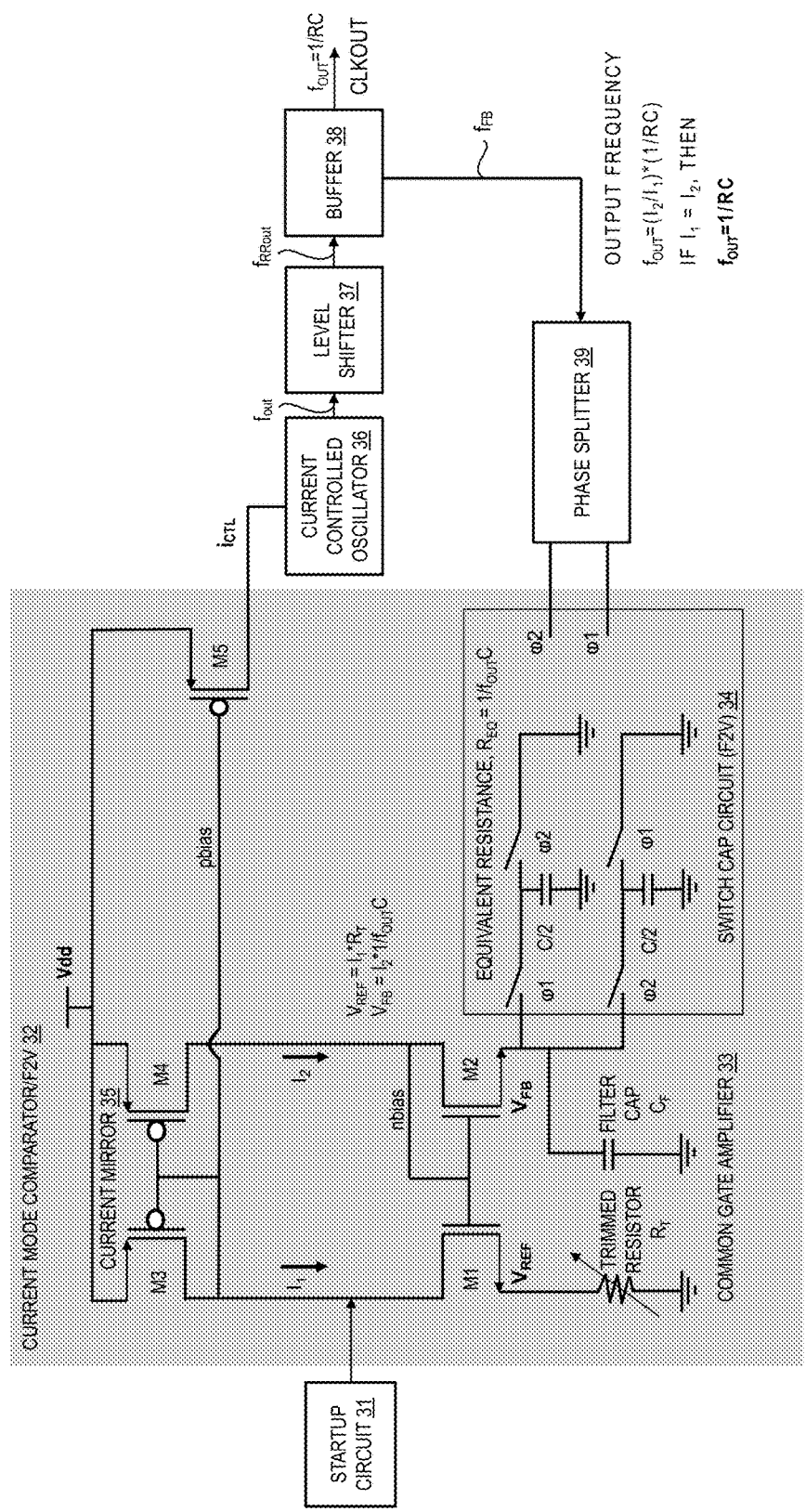
FIG. 3 illustrates a schematic circuit block diagram of clock generator which uses a low current, self-biased, closed-loop, free running oscillator circuit in accordance with selected embodiments of the present disclosure.

To provide additional details for an improved understanding of a clock generator circuit which employs a self-biased FRO circuit, reference is now made to FIG. 3 which shows a schematic circuit block diagram of a clock generator circuit 30 which employs a low current, self-biased, closed-loop, free running oscillator circuit arrangement in accordance with selected embodiments of the present disclosure. As depicted, the clock generator 30 includes a startup circuit 31, a current mode comparator and frequency-to-voltage converter (F2V) circuit 32, a current controlled oscillator (CCO) 36, a level shifter 37, a buffer 38, and a phase splitter 39 connected in a closed-loop feedback arrangement which does not require a separate current/voltage reference circuit subblock.

In operation, the startup circuit 31 initiates the operation of a current mode comparator/F2V circuit 32 by producing a startup current to the transistors M1, M3 to begin conducting current $I_1$. Once initiated, the current mode comparator/F2V circuit 32 generates a control voltage or current signal $i_{CTL}$ which is supplied to the CCO 36. The CCO 36 may be any suitable type of oscillator circuit (such as a ring oscillator-based CCO, a dedicated current starved, inverter-based ring oscillator, or the like) that is adapted to generate a clock signal $f_{out}$ based on the control current signal $i_{CTL}$. Since the generated clock signal $f_{out}$ is not a rail-to-rail clock, the clock signal $f_{out}$ may be supplied to the level shifter unit 37 which converts the clock signal $f_{out}$ output from the CCO 36 to a rail-to-rail clock signal $f_{RRout}$ that is supplied to the output buffer 38 which generates the output clock signal CLKOUT. In addition, buffer 38 provides the buffer output feedback signal f FB to the phase splitter 39 where it is converted to the feedback voltage ($V_{FB}$) which is provided to the current mode comparator/F2V circuit 32. Alternatively, the rail-to-rail clock signal $f_{RRout}$ generated by the level shifter unit 37 may be supplied directly to the phase splitter 39 after additional buffering. At the phase splitter 39, the received buffer output feedback signal $f_{FB}$ is split into separate control phase signals φ1, φ2, such as by using a plurality of inverters to output a first control phase signal φ1 (from positive edges of the received buffer output feedback signal $f_{FB}$) and to output a second control phase signal φ2 (from negative edges of the received buffer output feedback signal $f_{FB}$).

Notably, there is no external reference voltage generator connected to generate a voltage reference $V_{REF}$ input to the clock generator 30 because the current mode comparator/F2V circuit 32 is configured to internally generate a reference voltage $V_{REF}$. To this end, the current mode comparator/F2V circuit 32 includes the common gate amplifier circuit 33 which includes gate-connected first and second NMOS transistors M1, M2 with a common gate connected to the drain of the second NMOS transistor M2. In addition, the sources of the first and second NMOS transistors M1, M2 are connected, respectively, to a trimmed resistor and switched capacitor arrangement to produce, respectively, an internal reference voltage $V_{REF}$ and a feedback voltage $V_{FB}$. In addition, the current mode comparator/F2V circuit 32 includes a PMOS current mirror circuit 35 which is connected with the common gate amplifier circuit 33 to generate a negative bias signal (NBIAS), thereby providing a negative self-biasing loop which keeps the FRO output frequency within defined tolerance limits. In particular, the PMOS current mirror 35 includes first and second PMOS transistors M3, M4 connected between the supply voltage Vdd and the respective drains of the NMOS transistors M1, M2, where a common gate of the first and second PMOS transistors M3, M4 is connected to a drain of the first PMOS transistor M3 to provide a positive bias signal (PBIAS). The PMOS current mirror circuit 35 also includes a third PMOS transistor M5 connected between the supply voltage Vdd and the CCO 36 to generate the control current $i_{CTL}$ in response to the positive signal (PBIAS) supplied by the shared gate of the first and second PMOS transistors M3, M4.

In order to internally generate the voltage reference $V_{REF}$, the first NMOS transistor M1 of the common gate amplifier circuit 33 is connected to ground over a trimmed resistor $R_T$. In selected embodiments, the source impedance of the first NMOS transistor M1 may be set by a resistive digital-to-analog converter (RDAC) or by trimming the resistance at the source of the first NMOS transistor M1. By providing the trimmed resistor $R_T$, the frequency of the clock circuit may be tuned to a desired or nominal value (e.g., $f_{OUT}=1/R_T C$ 225=32 kHz). In addition, the combination of the common gate amplifier circuit 33 and the current mirror circuit 35 internally generates the reference voltage ($V_{REF}$) at the source of the first NMOS transistor M1 that is a function of the current $I_1$ generated by the first PMOS transistor M3 and the trimmed resistor value $R_T$ (e.g., $V_{REF}=I_1 R_T$).

In similar fashion, the common gate amplifier circuit 33 may include a second NMOS transistor M2 connected to receive the feedback voltage $V_{FB}$ from switched capacitor frequency-to-voltage converter 34 which converts the output clock frequency to the feedback voltage $V_{FB}$. In the depicted embodiment, the phase splitter 39 is connected to receive the output clock frequency and is configured to generate control phase signals φ1, φ2 for input to the switched capacitor frequency-to-voltage converter 34. The control phase signals φ1, φ2 are applied to the switched capacitor frequency-to-voltage converter 34 to generate the feedback voltage $V_{FB}$ as shown by alternately charging and discharging the pair of switched capacitors between ground and the source of the second NMOS transistor M2, where each of the switched capacitors have a predetermined C/2 capacitance value.

In the depicted arrangement of the current mode comparator/F2V circuit 32, the combination of the common gate amplifier circuit 33 and the current mirror circuit 35 generate the feedback voltage ($V_{FB}=I_2/f_{OUT} C$) at the source of the second NMOS transistor M2 that is a product of the current $I_2$ generated by the second PMOS transistor M4 and the equivalent resistance value ($R_{EQ}=1/f_{OUT} C$) of the switched capacitor frequency-to-voltage converter 34. As depicted, the source of the second NMOS transistor M2 is also connected to ground over to a filtering capacitor $C_F$ which is sized to remove ripples from the feedback voltage, but without otherwise affecting the output from the switched capacitor frequency-to-voltage converter 34.

With the current mode comparator/F2V circuit 32 configured in a negative feedback loop, the feedback voltage ($V_{FB}$) is compared to the internally generated reference voltage ($V_{REF}$) to generate the control current signal $i_{CTL}$ which in turn controls the frequency of the clock signal $f_{out}$ generated by the CCO 36. With the negative, self-biased loop, the current mode comparator/F2V circuit 32 loop locks when $V_{REF}=V_{FB}$ which occurs when $I_1 R_T=I_2/f_{OUT} C$. In this locked state, the frequency of the clock signal $f_{out}=(I_2/I_1)*(1/R_T C)=1/R_T C$ when $I_2=I_1$. As a result, the disclosed FRO clock generator can generate low power, low frequency clock signals (e.g., fOUT=32 kHz at 90 nA), but is also a versatile design which can be extended to any range of operating frequency by tuning the trimming resistor value $R_T$. In addition, the disclosed FRO clock generator provides a mechanism to compensate for the temperature drift in a closed loop manner. Yet another benefit of the disclosed FRO clock generator is demonstrated with PVT simulations which demonstrate that the trimming resistance $R_T$ decreases monotonically with increasing trim codes used to set the value of the trimming resistance $R_T$, with resistance varying from 4.3 MΩ to 11.5 MΩ across different PVT conditions. In addition, PVT simulations show that the clock frequency of the disclosed FRO clock generator increases monotonically with increasing trim codes used to set the value of the trimming resistance $R_T$. PVT simulations also show that clock frequency variations with respect to temperature follow resistance variations with respect to temperature.

In summary, there is disclosed herein a self-biased, low-current, free running oscillator arrangement that generates a stable clock frequency which is insensitive to supply variation with low current consumption and low circuit area. In addition, the disclosed self-biased, low-current, free running oscillator arrangement has low sensitivity to temperature variations, as it is mainly due to temperature sensitivity of the resistance. This may be achieved by using a current mode comparator circuit in which a common gate amplifier and current mirror circuit are connected to a trimmed resistor $R_T$ to internally generate a reference voltage $V_{REF}$, and are also connected to an integrated switched capacitor frequency-to-voltage converter having an equivalent resistance of $R_{EQ}=1/f_{OUT}*C$ to internally generate a feedback voltage $V_{FB}$ for comparison to the reference voltage $V_{REF}$ using a negative feedback loop to control a current controlled oscillator which generates an output clock signal having a frequency of $f_{OUT}=1/R_TC$. In a further embodiment, the trimmed resistor in the current mode comparator may be used for adjusting the frequency of the output clock signal $f_{OUT}$. This implementation is low area and has low post trim output frequency variation. In addition, trimming support is implemented in the design to ensure trim resolution of less than 1%. In addition, the closed loop implementation of the design means that comparator delay variation does not affect the output frequency.

By now, it should be appreciated that there has been provided herein a free running oscillator (FRO) clock generator, method, and system for generating an output clock signal having a nominal or target clock frequency. As disclosed, the FRO clock generator includes a current mode comparator that is connected to a trimming resistor and configured to compare an internally generated voltage reference $V_{REF}$ signal to a voltage feedback signal $V_{FB}$. The disclosed current mode comparator includes a common gate amplifier connected to a current mirror circuit in a negative self-biased closed loop to generate a control current signal. In addition, the FRO clock generator includes a current controlled oscillator that is connected to receive the control current signal and that is configured to produce the output clock signal based on the control current signal, where the clock frequency of the output clock signal is tuned to a nominal locked value by the trimming resistor. In selected embodiments, the trimming resistor may be embodied as a resistive digital-to-analog converter (RDAC) connected between the common gate amplifier and ground. The FRO clock generator also includes a frequency-to-voltage converter connected in a feedback path to receive the output clock signal and configured to produce the voltage feedback signal $V_{FB}$ for input to the current mode comparator. In selected embodiments, the frequency-to-voltage converter may be embodied as a switched capacitor circuit that is connected to a phase splitter circuit and configured to generate the voltage feedback signal $V_{FB}$ from a plurality of control phase signals generated by the phase splitter based on the output clock signal. In selected embodiments, the common gate amplifier includes first and second NMOS transistors having their gates connected together, where the first NMOS transistor has a source impedance set by the trimming resistor to generate the internally generated voltage reference signal $V_{REF}$, and where the second NMOS transistor has a source impedance set by the frequency-to-voltage converter to generate the voltage feedback signal $V_{FB}$. In addition, the current mirror circuit may include first and second PMOS transistors having their gates connected together to a gate of a third PMOS transistor and to a drain of the first PMOS transistor, where the first, second and third PMOS transistors each have a source connected to a supply voltage Vdd, where the drain of the first PMOS transistor is connected to a drain of the first NMOS transistor, where the second PMOS transistor has a drain connected to a drain of the second NMOS transistor, and where drain of the third PMOS transistor generates the control current signal. In selected embodiments, the first and second PMOS transistors are connected to generate, respectively, first and second currents $I_1$ and $I_2$ with the current mirror circuit so that the first current $I_1$ controls the gate of the third PMOS transistor to provide the control current signal for a targeted clock frequency. In selected embodiments, the disclosed FRO clock generator may also include a level shifter circuit coupled between the current controlled oscillator and the frequency-to-voltage converter, wherein the level shifter circuit is adapted to convert the output clock signal generated by the current controlled oscillator into a rail-to-rail clock signal. In other embodiments, the FRO clock generator generates the output clock signal to have a clock frequency of 32 KHz.

In another form, there has been provided a method of generating an output clock signal with free running oscillator (FRO) clock generator. In the disclosed method, a current controlled oscillator generates a clock signal based on a control current signal, wherein a buffered version of the clock signal is supplied to a phase splitter. In selected embodiments of the disclosed method, a level shifter circuit converts the clock signal to a rail-to-rail clock signal which is supplied to an output buffer which generates the buffered version of the clock signal that is supplied to a phase splitter. In the disclosed method, the phase splitter generates a pair of control phase signals in response to the buffered version of the clock signal, wherein the pair of control phase signals is supplied to a switched capacitor frequency-to-voltage converter. In selected embodiments, the phase splitter generates the pair of control phase signals by using a plurality of inverters to output a first control phase signal φ1 from positive edges of the buffered version of the clock signal and to output a second control phase signal φ2 from negative edges of the buffered version of the clock signal. In the disclosed method, the switched capacitor frequency-to-voltage converter generates a feedback voltage signal based on the pair of control phase signals. In selected embodiments, the switched capacitor frequency-to-voltage converter generates the feedback voltage signal by alternately applying the pair of control phase signals to opposite ends of first and second switched capacitors which each have a predetermined C/2 capacitance value. In the disclosed method, a trimming resistor generates an internally generated reference voltage signal based on a first current signal supplied by a current mode comparator. In selected embodiments, the trimming resistor is a resistive digital-to-analog converter (RDAC) connected between the current mode comparator and ground. In the disclosed method, the current mode comparator receives the feedback voltage signal at a first input terminal and receives the internally generated reference voltage signal at a second input terminal. In addition, the current mode comparator generates an output signal which is provided as the control current signal to the current controlled oscillator in order to control the frequency of the clock signal which is tuned to a nominal locked value by the trimming resistor which is connected between the current mode comparator and ground. In selected embodiments, the current mode comparator includes a common gate amplifier connected to a current mirror circuit in a negative self-biased closed loop to generate the control current signal. In selected embodiments, the clock signal has a clock frequency of 32 KHz, though other nominal clock frequencies may be generated.

In yet another form, there has been provided a self-biased, closed-loop integrated circuit RC free running oscillator (FRO) circuit. The disclosed FRO circuit includes a current mode comparator connected to internally generate a reference voltage signal $V_{REF}$ with a trimming resistor having a value $R_T$ and configured with a common gate amplifier connected to a current mirror circuit in a negative self-biased closed loop to generate a control current signal in response to comparing the reference voltage signal to a feedback voltage signal. In selected embodiments, the trimming resistor may be a resistive digital-to-analog converter (RDAC) connected between the common gate amplifier and ground. In selected embodiments, the common gate amplifier includes first and second NMOS transistors having their gates connected together, where the first NMOS transistor has a source impedance set by the trimming resistor to generate the internally generated reference voltage signal, and where the second NMOS transistor has a source impedance set by the switched capacitor frequency-to-voltage converter to generate the feedback voltage signal. In such embodiments, the current mirror circuit includes first and second PMOS transistors having their gates connected together to a gate of a third PMOS transistor and to a drain of the first PMOS transistor, where the first, second and third PMOS transistors each have a source connected to a supply voltage Vdd, where the drain of the first PMOS transistor is connected to a drain of the first NMOS transistor, where the second PMOS transistor has a drain connected to a drain of the second NMOS transistor, and where drain of the third PMOS transistor generates the control current signal. In such embodiments, the first and second PMOS transistors may be connected to generate, respectively, first and second currents $I_1$ and $I_2$ with the current mirror circuit so that the first current $I_1$ controls the gate of the third PMOS transistor to provide the control current signal for a targeted clock frequency. The disclosed FRO circuit also includes a current controlled oscillator connected to receive the control current signal and configured to generate, in response to the control current signal, an output clock signal tuned to a nominal locked frequency value $f_{OUT}=1/R_T C$. In addition, the disclosed FRO circuit includes a phase splitter circuit connected and configured to generate a pair of control phase signals in response to a buffered version of the output clock signal. The disclosed FRO circuit also includes a switched capacitor frequency-to-voltage converter connected and configured to generate a feedback voltage signal $V_{FB}$ in response to the pair of control phase signals, where the switched capacitor frequency-to-voltage converter generates the feedback voltage signal $V_{FB}$ by alternately applying the pair of control phase signals to opposite ends of first and second switched capacitors which each have a predetermined C/2 capacitance value.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified diagrams illustrating design and operational details of a free running oscillator clock generator with functional circuits, modules, blocks, and/or devices without including every device feature or aspect in order to avoid limiting or obscuring the present invention. Such descriptions and representations are used by those skilled in the art to describe and convey the substance of their work to others skilled in the art, and the omitted details which are well known are not considered necessary to teach one skilled in the art of how to make or use the present invention. Some portions of the detailed descriptions provided herein are also presented in terms of algorithms and instructions that operate on data that is stored in a computer memory. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that, throughout the description, discussions using terms such as "processing" or "computing" or "calculating" or "determining" or "displaying" or the like, refer to the action and processes of hardware or a computer system or a similar electronic computing device, that manipulates and transforms data represented as physical (electronic) quantities within registers and memories into other data similarly represented as physical quantities within the memories or registers or other such information storage, transmission or display devices.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Those skilled in the art will recognize that boundaries between the above-described operations or circuit functionalities are merely illustrative. The multiple operations or circuit functionalities may be combined into a single operation or circuit functionality, a single operation or circuit functionality may be distributed in additional operations or circuit functionalities, and operations or circuit functionalities may be executed at least partially overlapping in time. Moreover, alternative embodiments may include multiple instances of a particular operation or circuit functionality, and the order or arrangement of operations or circuit functionalities may be altered in various other embodiments. However, other modifications, variations and alternatives are also possible. The specifications and drawings are, accordingly, to be regarded in an illustrative rather than in a restrictive sense.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A free running oscillator clock generator, comprising:
   a current mode comparator connected to a trimming resistor and configured to compare an internally generated voltage reference VREF signal to a voltage feedback signal VFB, where the current mode comparator comprises a common gate amplifier connected to a current mirror circuit in a negative self-biased closed loop to generate a control current signal;
   a current controlled oscillator connected to receive the control current signal and configured to produce an output clock signal having a clock frequency based on the control current signal; and
   a frequency-to-voltage converter connected in a feedback path to receive the output clock signal and configured to produce the voltage feedback signal VFB for input to the current mode comparator,
   wherein the clock frequency of the output clock signal is tuned to a nominal locked value by the trimming resistor.

2. The free running oscillator clock generator of claim 1, where the common gate amplifier comprises first and second NMOS transistors having their gates connected together, where the first NMOS transistor has a source impedance set by the trimming resistor to generate the internally generated voltage reference signal VREF, and where the second NMOS transistor has a source impedance set by the frequency-to-voltage converter to generate the voltage feedback signal VFB.

3. The free running oscillator clock generator of claim 2, where the current mirror circuit comprises first and second PMOS transistors having their gates connected together to a gate of a third PMOS transistor and to a drain of the first PMOS transistor, where the first, second and third PMOS transistors each have a source connected to a supply voltage Vdd, where the drain of the first PMOS transistor is connected to a drain of the first NMOS transistor, where the second PMOS transistor has a drain connected to a drain of the second NMOS transistor, and where drain of the third PMOS transistor generates the control current signal.

4. The free running oscillator clock generator of claim 3, where first and second PMOS transistors are connected to generate, respectively, first and second currents I1 and I2 with the current mirror circuit so that the first current I1 controls the gate of the third PMOS transistor to provide the control current signal for a targeted clock frequency.

5. The free running oscillator clock generator of claim 1, where the trimming resistor comprises a resistive digital-to-analog converter (RDAC) connected between the common gate amplifier and ground.

6. The free running oscillator clock generator of claim 1, where the frequency-to-voltage converter comprises a switched capacitor circuit connected to a phase splitter circuit and configured to generate the voltage feedback signal VFB from a plurality of control phase signals generated by the phase splitter based on the output clock signal.

7. The free running oscillator clock generator of claim 1, further comprising a level shifter circuit coupled between the current controlled oscillator and the frequency-to-voltage converter, wherein the level shifter circuit is adapted to convert the output clock signal generated by the current controlled oscillator into a rail-to-rail clock signal.

8. The free running oscillator clock generator of claim 1, where the output clock signal has a clock frequency of 32 KHz.

9. A method of generating an output clock signal, comprising:
   generating, by a current controlled oscillator, a clock signal based on a control current signal, wherein a buffered version of the clock signal is supplied to a phase splitter;
   generating, by the phase splitter, a pair of control phase signals in response to the buffered version of the clock signal, wherein the pair of control phase signals is supplied to a switched capacitor frequency-to-voltage converter;
   generating, by the switched capacitor frequency-to-voltage converter, a feedback voltage signal based on the pair of control phase signals;
   generating, by a trimming resistor, an internally generated reference voltage signal based on a first current signal supplied by a current mode comparator;
   receiving, by the current mode comparator, the feedback voltage signal at a first input terminal and receiving, by the current mode comparator, the internally generated reference voltage signal at a second input terminal; and
   generating, by the current mode comparator, an output signal which is provided as the control current signal to the current controlled oscillator in order to control a frequency of the clock signal which is tuned to a nominal locked value by the trimming resistor which is connected between the current mode comparator and ground,
   where the current mode comparator comprises a common gate amplifier connected to a current mirror circuit in a negative self-biased closed loop to generate the control current signal.

10. The method of claim 9, further comprising:
    converting, by a level shifter circuit, the clock signal to a rail-to-rail clock signal which is supplied to an output buffer which generates the buffered version of the clock signal that is supplied to a phase splitter.

11. The method of claim 9, where the phase splitter generates the pair of control phase signals by using a plurality of inverters to output a first control phase signal φ1 from positive edges of the buffered version of the clock signal and to output a second control phase signal φ2 from negative edges of the buffered version of the clock signal.

12. The method of claim 9, where the switched capacitor frequency-to-voltage converter generates the feedback voltage signal by alternately applying the pair of control phase signals to opposite ends of first and second switched capacitors which each have a predetermined C/2 capacitance value.

13. The method of claim 9, where the trimming resistor comprises a resistive digital-to-analog converter (RDAC) connected between the current mode comparator and ground.

14. The method of claim 9, where the clock signal has a clock frequency of 32 KHz.

15. A self-biased, closed-loop integrated circuit resistor-capacitor (RC) free running oscillator circuit, comprising:
a current mode comparator connected to internally generate a reference voltage signal with a trimming resistor having a value RT and configured with a common gate amplifier connected to a current mirror circuit in a negative self-biased closed loop to generate a control current signal in response to comparing the reference voltage signal to a feedback voltage signal;
a current controlled oscillator connected to receive the control current signal and configured to generate, in response to the control current signal, an output clock signal tuned to a nominal locked frequency value fOUT=1/RTC;
a phase splitter circuit connected and configured to generate a pair of control phase signals in response to a buffered version of the output clock signal;
a switched capacitor frequency-to-voltage converter connected and configured to generate a feedback voltage signal in response to the pair of control phase signals, where the switched capacitor frequency-to-voltage converter generates the feedback voltage signal by alternately applying the pair of control phase signals to opposite ends of first and second switched capacitors which each have a predetermined C/2 capacitance value.

16. The self-biased, closed-loop integrated circuit RC free running oscillator circuit of claim 15, where the common gate amplifier comprises first and second NMOS transistors having their gates connected together, where the first NMOS transistor has a source impedance set by the trimming resistor to generate the internally generated reference voltage signal, and where the second NMOS transistor has a source impedance set by the switched capacitor frequency-to-voltage converter to generate the feedback voltage signal.

17. The self-biased, closed-loop integrated circuit RC free running oscillator circuit of claim 16, where the current mirror circuit comprises first and second PMOS transistors having their gates connected together to a gate of a third PMOS transistor and to a drain of the first PMOS transistor, where the first, second and third PMOS transistors each have a source connected to a supply voltage Vdd, where the drain of the first PMOS transistor is connected to a drain of the first NMOS transistor, where the second PMOS transistor has a drain connected to a drain of the second NMOS transistor, and where drain of the third PMOS transistor generates the control current signal.

18. The self-biased, closed-loop integrated circuit RC free running oscillator circuit of claim 17, where first and second PMOS transistors are connected to generate, respectively, first and second currents I1 and I2 with the current mirror circuit so that the first current I1 controls the gate of the third PMOS transistor to provide the control current signal for a targeted clock frequency.

19. The self-biased, closed-loop integrated circuit RC free running oscillator circuit of claim 15, where the trimming resistor comprises a resistive digital-to-analog converter (RDAC) connected between the common gate amplifier and ground.

* * * * *